US008044739B2

(12) United States Patent
Rangarajan et al.

(10) Patent No.: US 8,044,739 B2
(45) Date of Patent: Oct. 25, 2011

(54) CAPACITOR SWITCHING CIRCUIT

(75) Inventors: Rajagopalan Rangarajan, San Diego, CA (US); Chinmaya Mishra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 66 days.

(21) Appl. No.: 12/480,966

(22) Filed: Jun. 9, 2009

(65) Prior Publication Data

US 2010/0308932 A1     Dec. 9, 2010

(51) Int. Cl.
*H03B 5/08* (2006.01)
(52) U.S. Cl. ............... 331/167; 331/117 R; 327/337
(58) Field of Classification Search .......... 331/167, 331/117 R; 327/337, 392
See application file for complete search history.

(56) References Cited

U.S. PATENT DOCUMENTS

| | | | |
|---|---|---|---|
| 6,734,713 B1 * | 5/2004 | Magoon et al. | 327/382 |
| 6,815,996 B1 * | 11/2004 | Hsiao | 327/337 |
| 2005/0073371 A1 | 4/2005 | Brett et al. | |
| 2005/0231295 A1 | 10/2005 | Maeda | |
| 2006/0028283 A1 | 2/2006 | Sze et al. | |
| 2007/0085613 A1 | 4/2007 | Pittorino | |
| 2008/0129398 A1 * | 6/2008 | Sun et al. | 331/117 FE |

OTHER PUBLICATIONS

International Search Report and Written Opinion—PCT/US2010/038038, International Search Authority—European Patent Office—Sep. 6, 2010.

* cited by examiner

*Primary Examiner* — Joseph Chang
(74) *Attorney, Agent, or Firm* — Xiayu Xu (57) ABSTRACT

A capacitance switching element includes first and second capacitors connected in series by transistors. The gates of the transistors are biased by a first signal through one set of resistors, and the sources and drains are biased by a second signal through a second set of resistors. The signals are level-shifted and may be complimentary. To turn the element ON, the first signal may be set to $V_{DD}$ and the second signal may be set to zero. To turn the element OFF, the first signal may be set to a multiple of $V_{DD}/2$ and the second signal may be set to the multiple plus one of $V_{DD}/2$. When the element is used in an oscillator tuning circuit, the voltage stress on the transistors is reduced and the transistors may be fabricated with thin oxide. The oscillator may be used in a transceiver of a cellular access terminal.

35 Claims, 6 Drawing Sheets

CAPACITOR SWITCHING CIRCUIT

BACKGROUND

1. Field

Apparatus and methods described in this document relate to switching circuits and, more specifically, to capacitor switching circuits for tuning oscillator frequency in communication equipment.

2. Background

Tunable frequency generators are used in many different electronic devices. Wireless communication devices, for example, use frequency generators for upconversion of transmitted signals to intermediate and RF frequencies, and for downconversion of received signals to intermediate and baseband frequencies. Because operating frequencies vary, the generators' frequencies need to be tunable.

Frequency coverage required for multiple communication standards and multiple bands typically necessitates wide tuning range oscillators, such as voltage controlled oscillators (VCOs) and digitally controlled oscillators (DCOs). The extent of an oscillator's tuning range is one important performance parameter. It is often desirable to increase the tuning range, for example, in order to cover multiple bands.

Other performance criteria of tunable oscillators include phase noise performance, power consumption, and size. The different performance criteria are sometimes competing.

Conventional tunable oscillators may be tuned, for example, by switching capacitors into and out of the oscillator inductance-capacitance (LC) tank. The highest frequency and the accuracy of tuning of such a tunable oscillator may both be limited by the parasitic capacitances in the capacitance switching circuits. Therefore, it is desirable to reduce the parasitic capacitances associated with the tuning circuits.

Advancements in integrated circuit technology have enabled the shrinking of device sizes or scales, and thereby the reduction in supply voltage levels. Voltage swing requirements across different terminals of these devices, however, may not scale proportionally with device sizes. Stringent phase noise requirements in high performance oscillators for wireless applications may require relatively large voltage swings across the LC tank. For example, oscillator tank voltage swing may need to be as large as three volts peak-to-peak, to meet the phase noise specification requirements applicable to the Personal Communication Service (PCS) frequency band in CDMA 1× mode.

Large voltage swings may excessively stress transistor devices and reduce the devices' lifetime expectations, or cause outright device failures. Hence, reliability and durability concerns tend to play an important part in driving design decisions in nanometer complimentary metal oxide semiconductor (CMOS) processes.

Figure 1:
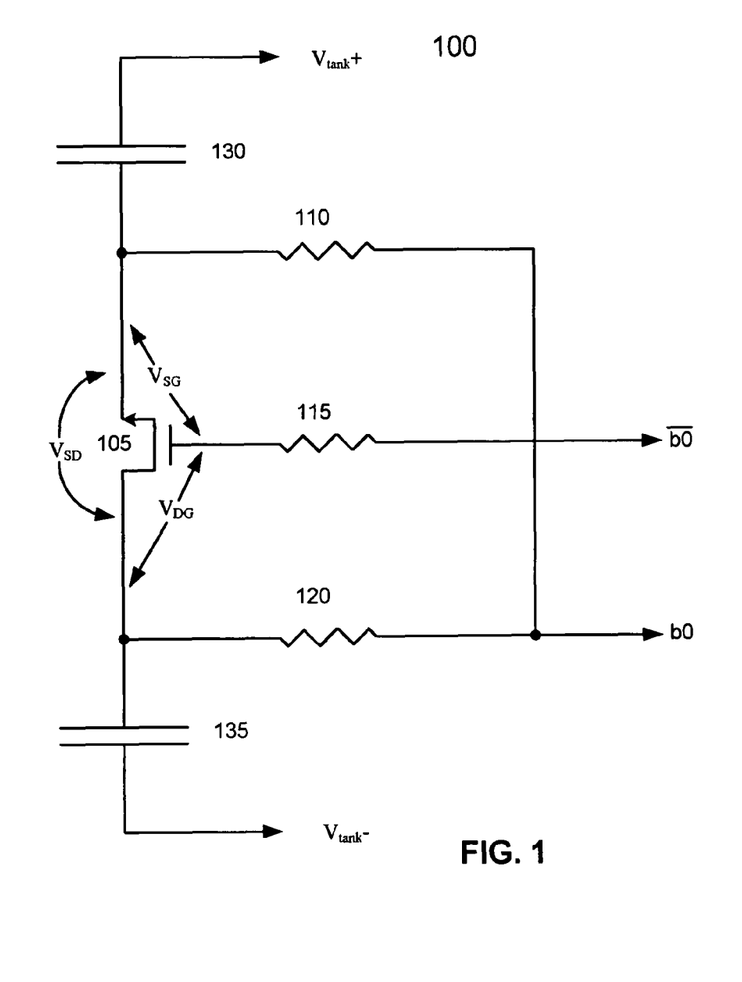
FIG. 1 illustrates selected components of a capacitance switching element that may be used in a tank of a tunable oscillator.

One of the important blocks of a tunable oscillator may be a coarse frequency tuning block, with an array or bank of binary-weighted capacitors with switches. FIG. 1 illustrates selected parts of one exemplary element 100 of a capacitor bank. The parts include a transistor switch 105, capacitors 130 and 135, and resistors 110, 115, and 120.

The element is configured so that the state of the transistor 105 is controlled by the complimentary control signal voltages b0 and $\overline{b0}$. When b0 is low and $\overline{b0}$ is high, the transistor 105 is in the conducting (low impedance) state, placing the series combination of the capacitors 130/135 effectively in the tank circuit of the tunable oscillator. When b0 is high and $\overline{b0}$ is low, the transistor 105 is in the non-conducting (high impedance) state, effectively removing the series combination of the capacitors 130/135 from the tank circuit of the tunable oscillator. Assuming that the parasitic capacitance between the drain and source of the transistor 105 is small compared to the capacitances of the capacitors 130/135, it is the parasitic capacitance that dominates the total capacitance contributed to the tank circuit by the element 100. Therefore, it is desirable to keep the parasitic capacitance low, so that the effect of the element 100 on the tank circuit is reduced in the non-conducting state.

In the off state of the transistor 105, the maximum potential differences between source and drain ($V_{SD}$), source and gate ($V_{SG}$), and drain and gate ($V_{DG}$) depend on the control voltages b0 and $\overline{b0}$ and the voltages across the tank circuit of the tunable oscillator. Assuming that (1) the voltage across the tank of the oscillator varies between ground and $2 \times V_{DD}$ potentials, and (2) the control signal voltages b0 and $\overline{b0}$ also vary between ground and $V_{DD}$ potentials, the magnitude of the potential differences $V_{SD}$, $V_{SG}$, and $V_{DG}$ reaches ($2 \times V_{DD}$). As noted above, this may unduly stress the transistor 105, particularly in small scale nanometer designs, and thus cause reductions in the reliability and durability performance metrics of the transistor 105. The breakdown problem may be present in 65 nanometer scale designs, and is likely to aggravate as technology progresses to 45 nanometer scale, 32 nanometer scale, and deeper into the sub-micron region.

One way to improve the reliability and durability of the transistor switches is to use thick oxide devices in the capacitor bank transistor switches, such as the transistor 105. Thick oxide transistors, as their name implies, have thicker oxide in their gate (as compared to thin oxide transistors), and hence can sustain higher gate-to-source and gate-to-drain voltages before breaking down. Although the potential differences across the transistor nodes remain the same with the thick oxide approach as with the thin oxide approach, the reliability and durability are improved because the thicker oxide breaks down at higher voltages. This advantage, however, comes at a cost: the thick oxide transistors also have large parasitic capacitances in the off (high impedance) state, which directly affects the tuning range. As discussed above, this is undesirable, especially in wide tuning range oscillators.

Therefore, there is a need in the art to improve reliability and durability of tunable capacitor banks, and particularly to improve reliability and durability of the transistor switches of such banks. There is a further need in the art to reduce the voltage stress on the individual transistor switches in capacitor banks of tunable oscillators. There is also a need in the art to reduce the voltage stress on the individual transistor switches in capacitor banks of tunable oscillators without unduly increasing parasitic capacitances of the transistors.

SUMMARY

Embodiments disclosed herein may address one or more of the above stated needs by stacking multiple transistors to make a switch of an individual element of a tuning capacitor bank, with level shifting of control voltages of the transistors. Each of the transistors may need to withstand only a fraction of the voltage swing across the LC tank of the oscillator, and may be made as a thin oxide transistor with its associated low OFF state capacitance.

In an embodiment, a capacitance switching element includes a first capacitor, a second capacitor, a first transistor, a second transistor, and first through fifth resistors. The first and the second transistors are coupled in series between the first capacitor and the second capacitor. The first resistor connects the gate of the first transistor to a first control signal. The second resistor connects the gate of the second transistor to the first control signal. The third resistor connects the drain of the second transistor to a second control signal. The fourth resistor connects the source of the first transistor to the second control signal. The fifth resistor connects the source of the second transistor and the drain of the first transistor to the second control signal. The second control signal is a level-shifted compliment of the first control signal.

In an embodiment, a capacitance switching element includes a first capacitor, a second capacitor, a first transistor, a second transistor, a third transistor, and first through seventh resistors. The first, second, and third transistors are coupled in series between the first capacitor and the second capacitor. The first resistor connects the gate of the first transistor to a first control signal. The second resistor connects the gate of the second transistor to the first control signal. The third resistor connects the gate of the third transistor to the first control signal. The fourth resistor connects the drain of the third transistor to a second control signal. The fifth resistor connects the source of the third transistor and the drain of the second transistor to the second control signal. The sixth resistor connects the source of the second transistor and the drain of the first transistor to the second control signal. The seventh resistor connects the source of the first transistor to the second control signal. The capacitance switching element is configured to operate from a power supply configured to deliver a supply voltage potential ($V_{DD}$) and ground potential. The first control signal is pulled up to substantially the $V_{DD}$. The second control signal switches between (1) substantially the ground potential to connect the first capacitor to the second capacitor, and (2) substantially one and a half times the $V_{DD}$ potential to disconnect the first capacitor from the second capacitor.

In an embodiment, a capacitance switching element includes a first capacitor, a second capacitor, and a plurality of n transistors (n≧3). The transistors are coupled in series between the first capacitor and the second capacitor. The capacitance switching element also includes a first plurality of resistors connecting the gates of the transistors to a first control signal, and a second plurality of resistors connecting the drains and sources of the transistors to a second control signal. The capacitance switching element is configured to operate from a power supply that delivers a supply voltage potential ($V_{DD}$) and a ground potential. The first control signal switches between substantially the $V_{DD}$ and substantially ((n−1)/2) times the $V_{DD}$. The second control signal switches between substantially the ground potential and substantially (n/2) times the $V_{DD}$ potential.

In an embodiment, a capacitance switching element includes a first capacitor, a second capacitor, and a means for selectively coupling the first capacitor and the second capacitor in series and reducing transistor voltage stress.

In an embodiment, a method of switching capacitance includes providing a first capacitor and a second capacitor. The method also includes providing a first transistor and a second transistor coupled in series between the first capacitor and the second capacitor. The method additionally includes biasing gates of the first and second transistors at substantially a supply voltage $V_{DD}$ and biasing sources and drains of the first and second transistors at substantially ground potential, thereby connecting the first capacitor to the second capacitor. The method further includes biasing the gates of the first and second transistors at substantially one half of the $V_{DD}$ and biasing the sources and drains of the first and second transistors at substantially the $V_{DD}$, thereby disconnecting the first capacitor from the second capacitor.

In an embodiment, a method of switching capacitance includes providing a first capacitor, a second capacitor, and a plurality of n (three or more) transistors. The transistors are coupled in series between the first capacitor and the second capacitor. The method also includes biasing gates of each transistor at substantially a supply voltage $V_{DD}$ and biasing sources and drains of each transistor at substantially ground potential, thereby connecting the first capacitor to the second capacitor. The method additionally includes biasing the gates at substantially ((n−1)/2) times $V_{DD}$ and biasing the sources and drains at substantially (n/2) times $V_{DD}$, thereby disconnecting the first capacitor from the second capacitor.

These and other embodiments and aspects of the present invention will be better understood with reference to the following description, drawings, and appended claims.

DETAILED DESCRIPTION

In this document, the words "embodiment," "variant," and similar expressions are used to refer to particular apparatus, process, or article of manufacture, and not necessarily to the same apparatus, process, or article of manufacture. Thus, "one embodiment" (or a similar expression) used in one place or context may refer to a particular apparatus, process, or article of manufacture; the same or a similar expression in a different place may refer to a different apparatus, process, or article of manufacture. The expression "alternative embodiment" and similar phrases may be used to indicate one of a number of different possible embodiments. The number of possible embodiments is not necessarily limited to two or any other quantity.

The word "exemplary" may be used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the invention.

The "VCO" and "DCO" designations may be used interchangeably within the description, each referring to a tunable oscillator, particularly where the oscillator is tunable through switching capacitors in the oscillator's LC tank.

"Thin oxide" refers to the standard oxide thickness of the chip (integrated circuit) on which a particular thin oxide transistor is fabricated. A majority of transistors on a chip are thin oxide transistors. A "thick oxide" transistor is a transistor with oxide thickness increased relative to the oxide thickness of the majority of transistors on the same chip. Typically, the oxide thickness is increased to enhance the breakdown voltage of the thick oxide transistor, and thus to improve reliability and durability of the thick oxide transistor.

Figure 2:
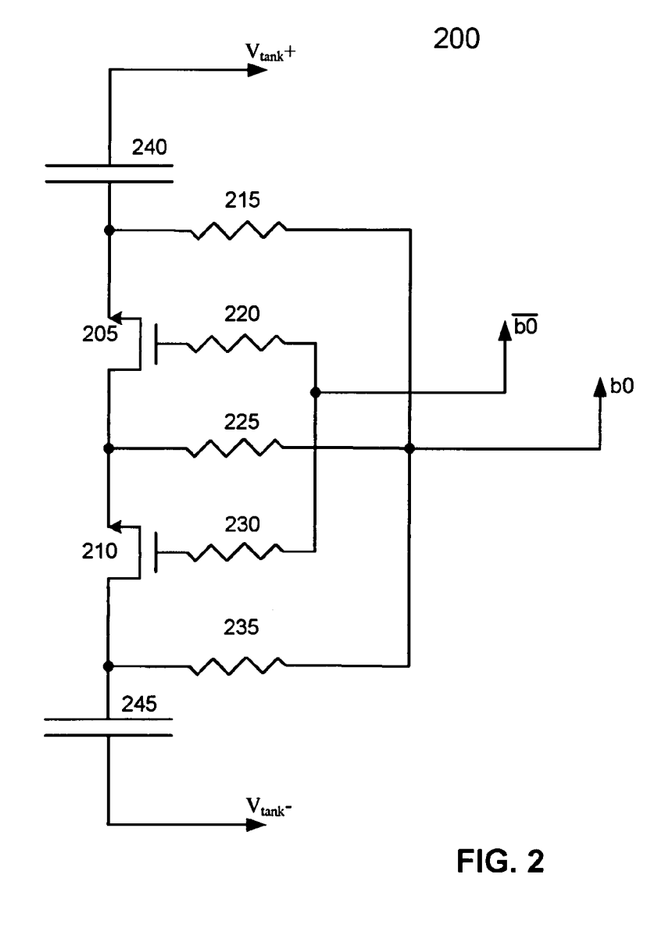
FIG. 2 illustrates selected components of a two-transistor capacitance switching element that may be used in a tank of a tunable oscillator.

FIG. 2 illustrates selected parts of an exemplary element 200 of a capacitor bank in a tunable oscillator. The element 200 includes two switching transistors 205 and 210 configured in series between capacitors 240 and 245 as shown, to reduce the parasitic capacitances and at the same time reduce potential reliability and durability problems. The capacitors 240 and 245 may be designed to have the same nominal capacitance value.

The switching of the transistors 205 and 210 is controlled by control signals b0 and $\overline{b0}$ through resistors 215, 220, 225, 230, and 235. The control signals b0 and $\overline{b0}$ are compliments of each other, so that b0 is active high when $\overline{b0}$ is inactive low, and vice versa. Unlike the element 100 of FIG. 1, here the control signals b0 and $\overline{b0}$ are level shifted with respect to each other. For example, when the element 200 is ON (both transistors 205/210 are conducting), $\overline{b0}$ is at the $V_{DD}$ potential, and b0 is at zero or ground potential; and when the element 200 is OFF (the transistors 205/210 are not conducting), $\overline{b0}$ is at about $V_{DD}/2$ potential, and b0 is at the $V_{DD}$ potential. If $\overline{b0}$ is lower than $V_{DD}/2$ in the OFF state, the gate-to-source voltage may become greater than −Vdd, which may result in a less than optimal design. On the other hand, if $\overline{b0}$ is higher than $V_{DD}/2$, the gate-to-drain voltage could become higher than ground potential, as the mid-node is a virtual ground, staying approximately at $V_{DD}$.

In some embodiments, the $\overline{b0}$ voltage in the OFF state is selected to be about $V_{DD}/2$, with the precision practical under the circumstances. For example, the precision may be defined and limited by tolerances of the components. In some embodiments, the $\overline{b0}$ voltage in the OFF state is within two percent, five percent, ten percent, or twenty percent of the exact value of $V_{DD}/2$. In some embodiments, the $\overline{b0}$ voltage in the ON state is within two percent, five percent, ten percent, or twenty percent of the exact value of $V_{DD}$. In some embodiments, the b0 voltage in the OFF state is within two percent, five percent, ten percent, or twenty percent of $V_{DD}$. In some embodiments, the b0 voltage in the ON state is within one hundred millivolts of ground potential.

The voltage stress is generally not a big concern when the element 200 (or 100, for that matter) is in the ON state, because the source-to-drain transistor voltage is low. In the OFF state, the capacitance between the two terminals of the tank ($V_{tank}+$ and $V_{tank}-$) does not form a virtual ground at the gates of the two transistors 205/210 (as it would in the element 100 at the gate of the transistor 105), thereby allowing the gates of the transistors 205/210 to follow the voltages on the respective drain of 210 or source of 205. This effectively limits the maximum potential difference between any two nodes of the transistors 205/210 (source, drain, gate) to the level of $V_{DD}$. Note that the potential difference between a source or a drain node and the transistor bulk may exceed $V_{DD}$, for example going to two times $V_{DD}$. But this may not be a reliability or durability concern at relatively low voltages, because the source or drain to bulk interface is essentially a diode junction.

Because of the lower voltages and the possible increase in the values of the biasing resistors, the quality factor (Q) of the element 200 in practice may be improved over that of the comparable (same frequency, same capacitor size) element 100 of FIG. 1.

Figure 3:
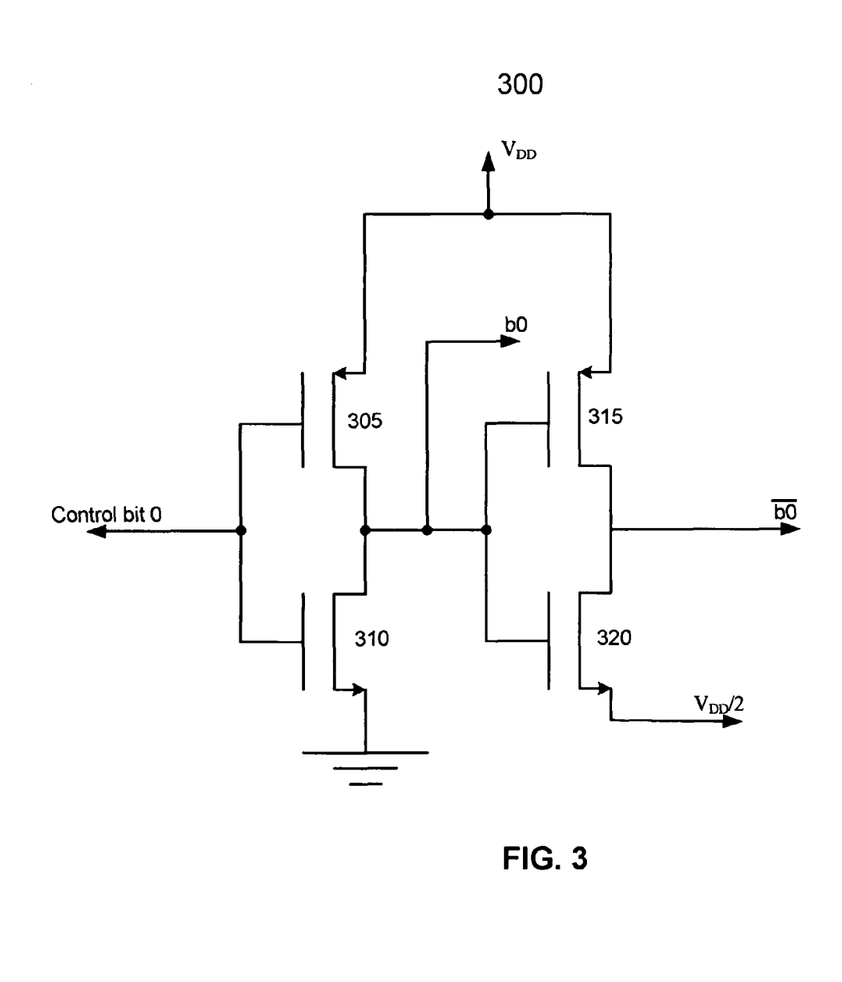
FIG. 3 illustrates selected components of a circuit for generating control signals for switching capacitances in elements such as the element of FIG. 2.

FIG. 3 illustrates selected parts of an exemplary circuit 300 for generating for the element 200 the signals b0 and $\overline{b0}$ from a single control bit 0 signal. The circuit 300 is essentially a two-inverter design, with a first inverter made of transistors 305 and 310, and the second inverter made of transistors 315 and 320. The first inverter operates between ground and $V_{DD}$, while the second inverter operates between $V_{DD}/2$ and $V_{DD}$, thus providing level-shifting of the signal $\overline{b0}$. Note that the use of the "0" notation in the Figures is exemplary, and that the inventive concepts may be applied not only to the control "0" bit, but to any one of the control bits, or any combination (including all) of the control bits of a tunable oscillator.

Figure 4:
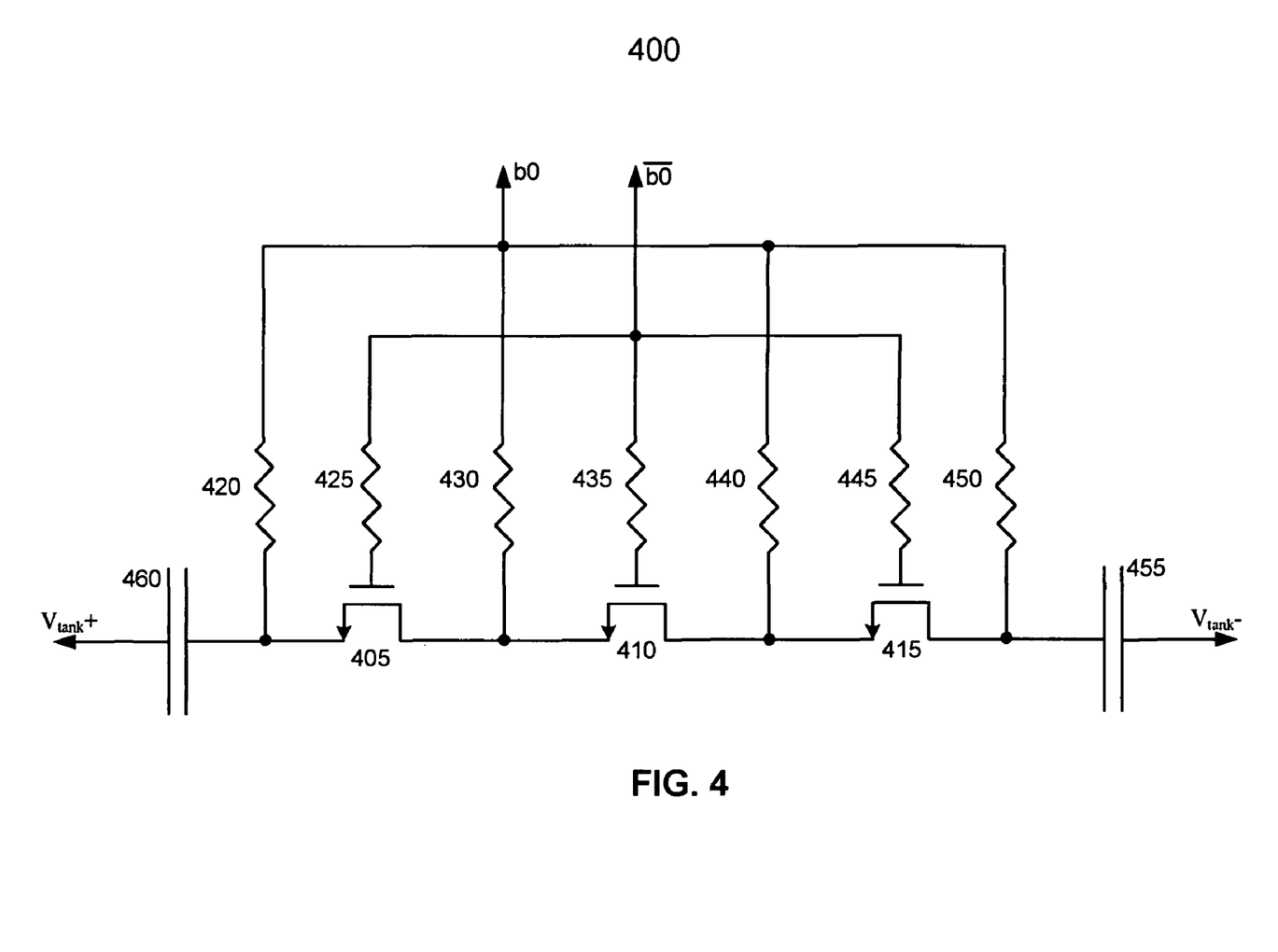
FIG. 4 illustrates selected components of a three-transistor capacitance switching element that may be used in a tank of a tunable oscillator.

More than two transistors may be stacked in series with appropriate level shifting of control voltages of the multiple transistors, to reduce further the voltage stress across the individual transistors and extend the reliability/durability benefits to higher tank swing voltages. FIG. 4 illustrates selected parts of an exemplary three-transistor element 400 of a capacitor bank in a tunable oscillator, which may advantageously operate with higher voltages, for example, with voltage swings of $-3V_{DD}$ to $+3V_{DD}$. The element 400 includes three switching transistors 405, 410, and 415 configured (stacked) in series as shown, to reduce the parasitic capacitances and at the same time reduce potential reliability and durability problems due to excessive voltage stress. The switching of the three transistors 405/410/415 is controlled by control signals b0 and $\overline{b0}$, which are applied through resistors 420, 425, 430, 435, 440, 445, and 450. Here, the control signal $\overline{b0}$ may be simply a pull-up to $V_{DD}$, and the control signal b0 may have a low voltage level of ground potential and a high voltage level of $(3/2)V_{DD}$ potential. For example, when the element 400 is ON (all three transistors 405/410/415 are conducting), $\overline{b0}$ may be biased at $V_{DD}$, and b0 may be biased at zero or ground potential; and when the element 400 is OFF (the transistors 405/410/415/420 are not conducting), $\overline{b0}$ may continue to be biased at about $V_{DD}$, and b0 may be biased at $(3/2)V_{DD}$ potential.

As in the embodiment of FIG. 2, the precision of the voltages of b0 and $\overline{b0}$ may be limited by tolerances of the components. In some embodiments, the precision may be two percent, five percent, ten percent, or twenty percent of the exact value shown above; and in the case of ground potential, the precision may be two percent, five percent, ten percent, or twenty percent of $V_{DD}$ or one hundred millivolts.

More generally, for oscillator tank voltage swings of $nV_{DD}$ ($n \geq 3$) and all n transistors in an element to be OFF, $\overline{b0}$ biases the transistor gates at about $((n-1)/2)V_{DD}$, and b0 biases the sources and drains of the transistors at about $(n/2)V_{DD}$; for all the n transistors to be conducting, b0 biases the gates at about zero or ground potential, and $\overline{b0}$ biases the sources and drains at about $V_{DD}$.

For designs with voltage swings not exceeding $2V_{DD}$, the element 200 may be used to keep the voltage stresses to about $V_{DD}$ or less. For designs where the expected voltage swing in the tank is $v \leq nV_{DD}$ (n being an integer), a structure of n stacked transistors can be used to keep the voltage stresses to about $V_{DD}$ or less.

Figure 5:
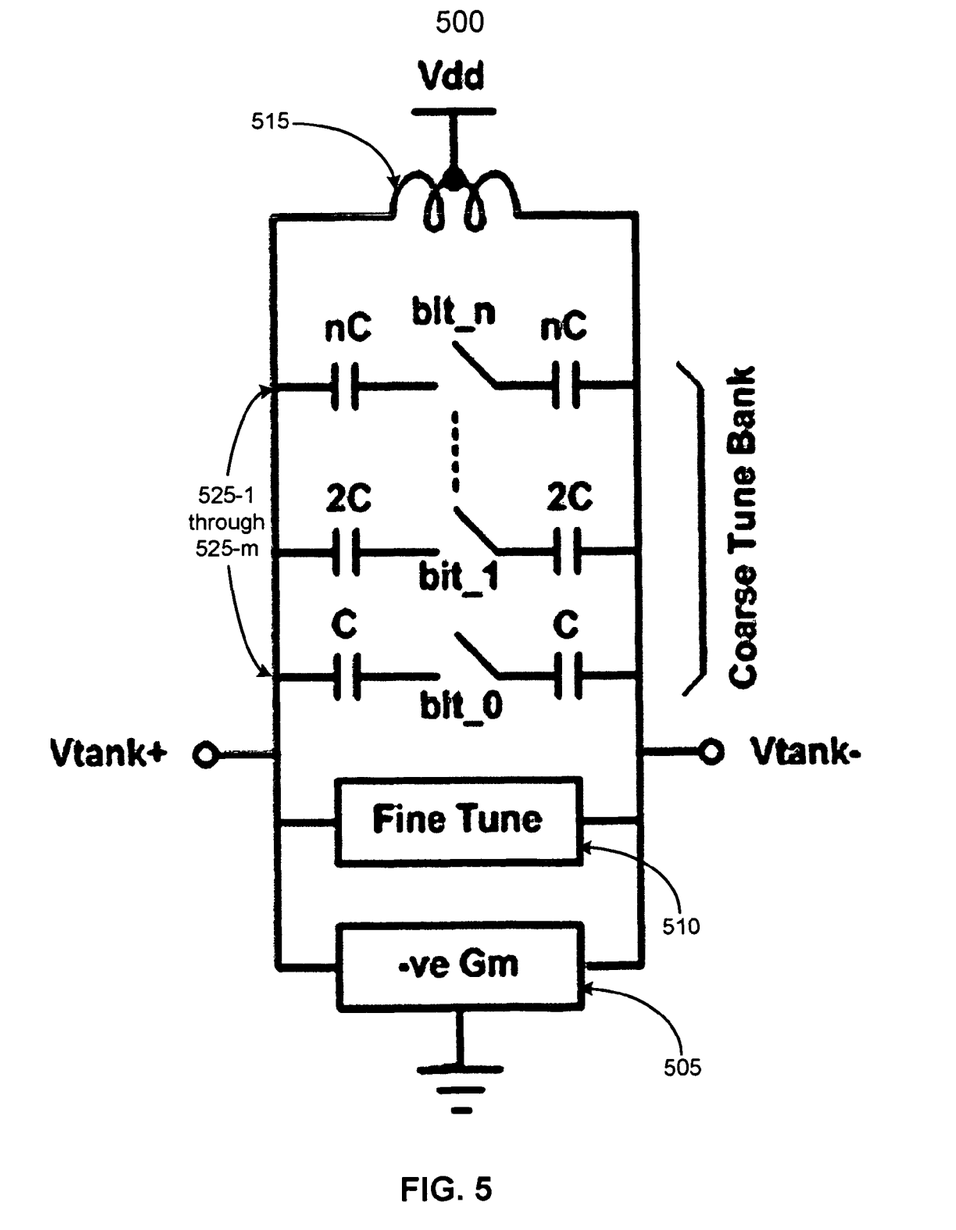
FIG. 5 illustrates selected components of a tunable oscillator with capacitance switching elements.

FIG. 5 illustrates selected components of a tunable oscillator 500 with capacitance switching elements 525-1, 525-2, . . . 525-m. Each of the capacitance switching elements 525 may be implemented as the elements 200 or the element 400 described above. The elements 525 make up a coarse tuning block of the oscillator 500. An inductor 515, the capacitors of the elements 525, and capacitors of a fine tuning block 510 make up an LC tank driven by a negative transconductance ($G_m$) block 505. It should be noted that the fine tuning block may also include elements analogous to the elements 200 and 400.

Although the capacitors of the elements 525 are shown as a binary array of capacitors (capacitance values of the pairs of capacitors in each element forming a substantially binary progression), this is not necessarily a requirement.

Figure 6:
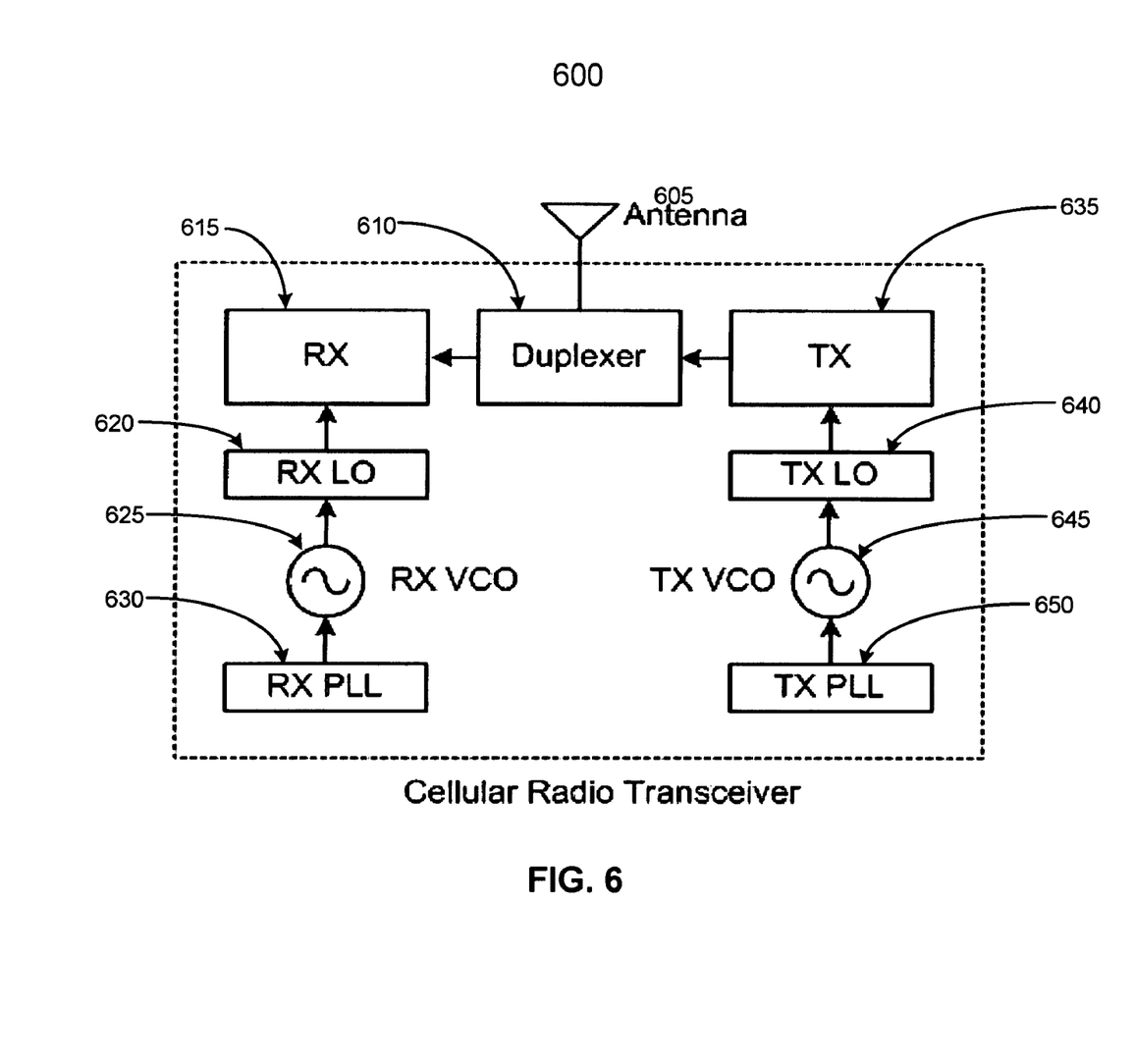
FIG. 6 illustrates selected components of a radio transceiver that may use one or more oscillators with capacitance switching elements.

FIG. 6 illustrates selected components of a radio transceiver 600, which may be a cellular transceiver. The transceiver 600 includes receive (Rx) phase lock loop (PLL) circuitry 630 for controlling an Rx oscillator 625 (i.e., phase locking the oscillator 625 to a reference), and other Rx circuitry 615 and 620. The Rx circuitry 615/620 is configured to receive (through an antenna 605 and a duplexer 610) a radio frequency (RF) signal and the Rx local oscillator frequency from the oscillator 625, and to produce decoded data from the received RF signal. The transceiver 600 also includes transmit (Tx) PLL circuitry 650 for controlling a Tx oscillator 645, and other transmit circuitry 635 and 640. The Tx circuitry 635/640 is configured to receive data for transmission and the output of the Tx oscillator 645, and generate an RF signal carrying the data. The RF signal from the circuitry 635/640 is then transmitted through the duplexer 610 and the antenna 605. Each or both of the oscillators 625 and 645 may be implemented as the oscillator 500, using capacitor switching elements such as the elements 200 and 400.

Both P-channel and N-channel field effect transistors (FETs) may be used.

In embodiments, the FETs shown in the Figures may be replaced by bipolar junction transistors (BJTs) or other similar switching devices. For example, a base node of a BJT may be substituted for a gate node of a FET in the same position; an emitter node of the BJT may be substituted for a source node of the FET; and a collector node of the BJT may be substituted for a drain node of the FET.

The apparatus and methods described in this document can be used in various electronic devices, including but not limited to access terminals operating within a cellular radio network transporting voice and/or data packets between multiple access terminals of the network, or between the access terminals and devices connected to additional networks outside the access network. As shown in FIG. 6, the apparatus and methods may be used in the local oscillator frequency source(s) of an access terminal.

Although steps and decisions of various methods may have been described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them, except where explicitly so indicated, otherwise made clear from the context, or inherently required. It should be noted, however, that in selected variants the steps and decisions are performed in the particular sequences that may be described and/or shown in the accompanying Figures. Furthermore, not every illustrated step and decision may be required in every embodiment or variant, while some steps and decisions that have not been specifically illustrated may be desirable in some embodiments/variants.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To show clearly this interchangeability of hardware and software, various illustrative components, blocks, modules, circuits, and steps may have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g. a combination of a DSP and a microprocessor, a plurality of microprocessors, one or more microprocessors in conjunction with a DSP core, or any other such configuration.

The steps of a method or algorithm that may have been described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. Alternatively, the processor and the storage medium may reside as discrete components in an access terminal.

The previous description of the disclosed embodiments is provided to enable any person skilled in the art to make and use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the widest scope consistent with the principles and novel features disclosed herein.

What is claimed is:

1. A capacitance switching element, comprising:
   a first capacitor;
   a second capacitor;
   a first transistor comprising a first gate, a first source, and a first drain;
   a second transistor comprising a second gate, a second source, and a second drain, wherein the first transistor and the second transistor are coupled in series between the first capacitor and the second capacitor;
   a first resistor connecting the first gate to a first control signal;

a second resistor connecting the second gate to the first control signal;
a third resistor connecting the second drain to a second control signal;
a fourth resistor connecting the first source to the second control signal; and
a fifth resistor connecting the second source and the first drain to the second control signal;
wherein the second control signal is a level-shifted compliment of the first control signal.

2. A capacitance switching element according to claim 1, wherein:
the capacitance switching element is configured to operate from a power supply configured to deliver a supply voltage potential ($V_{DD}$) and a ground potential;
the first control signal switches between substantially the $V_{DD}$ and substantially one half of the $V_{DD}$;
the second control signal switches between substantially the ground potential and substantially the $V_{DD}$.

3. A capacitance switching element according to claim 2, wherein the first transistor is a thin oxide transistor, and the second transistor is a thin oxide transistor.

4. A capacitance switching element according to claim 2, further comprising a level-shifting circuit configured to receive a bit control signal and generate the first control signal and the second control signal in response to the bit control signal.

5. A capacitance switching element according to claim 4, wherein the level shifting circuit comprises a first inverter and a second inverter coupled in series.

6. A capacitance switching element according to claim 2, further comprising a means for receiving a bit control signal and generating the first control signal and the second control signal based on the bit control signal.

7. An oscillator tuning block comprising:
a first capacitor;
a second capacitor;
a first transistor comprising a first gate, a first source, and a first drain;
a second transistor comprising a second gate, a second source, and a second drain, wherein the first transistor and the second transistor are coupled in series between the first capacitor and the second capacitor;
a first resistor connecting the first gate to a first control signal;
a second resistor connecting the second gate to the first control signal;
a third resistor connecting the second drain to a second control signal;
a fourth resistor connecting the first source to the second control signal; and
a fifth resistor connecting the second source and the first drain to the second control signal;
wherein:
the second control signal is a level-shifted compliment of the first control signal;
the capacitance switching element is configured to operate from a power supply configured to deliver a supply voltage potential ($V_{DD}$) and a ground potential;
the first control signal switches between substantially the $V_{DD}$ and substantially one half of the $V_{DD}$; and
the second control signal switches between substantially the ground potential and substantially the $V_{DD}$.

8. An oscillator comprising a negative transconductance block, an inductor, and a tuning block comprising:
a first capacitor;
a second capacitor;
a first transistor comprising a first gate, a first source, and a first drain;
a second transistor comprising a second gate, a second source, and a second drain, wherein the first transistor and the second transistor are coupled in series between the first capacitor and the second capacitor;
a first resistor connecting the first gate to a first control signal;
a second resistor connecting the second gate to the first control signal;
a third resistor connecting the second drain to a second control signal;
a fourth resistor connecting the first source to the second control signal; and
a fifth resistor connecting the second source and the first drain to the second control signal;
wherein:
the second control signal is a level-shifted compliment of the first control signal;
the capacitance switching element is configured to operate from a power supply configured to deliver a supply voltage potential ($V_{DD}$) and a ground potential;
the first control signal switches between substantially the $V_{DD}$ and substantially one half of the $V_{DD}$; and
the second control signal switches between substantially the ground potential and substantially the $V_{DD}$.

9. A transceiver comprising a receiver and a transmitter, wherein at least one of the receiver and the transmitter comprises:
an oscillator comprising a negative transconductance block, an inductor, and a tuning block, the tuning block comprising:
a first capacitor;
a second capacitor;
a first transistor comprising a first gate, a first source, and a first drain;
a second transistor comprising a second gate, a second source, and a second drain, wherein the first transistor and the second transistor are coupled in series between the first capacitor and the second capacitor;
a first resistor connecting the first gate to a first control signal;
a second resistor connecting the second gate to the first control signal;
a third resistor connecting the second drain to a second control signal;
a fourth resistor connecting the first source to the second control signal; and
a fifth resistor connecting the second source and the first drain to the second control signal;
wherein:
the second control signal is a level-shifted compliment of the first control signal;
the capacitance switching element is configured to operate from a power supply configured to deliver a supply voltage potential ($V_{DD}$) and a ground potential;
the first control signal switches between substantially the $V_{DD}$ and substantially one half of the $V_{DD}$; and
the second control signal switches between substantially the ground potential and substantially the $V_{DD}$.

10. An access terminal comprising a transceiver comprising:
a receiver; and
a transmitter, wherein at least one of the receiver and the transmitter comprises:
an oscillator comprising a negative transconductance block, an inductor, and a tuning block, the tuning block comprising:
a first capacitor;
a second capacitor;
a first transistor comprising a first gate, a first source, and a first drain;
a second transistor comprising a second gate, a second source, and a second drain, wherein the first transistor and the second transistor are coupled in series between the first capacitor and the second capacitor;
a first resistor connecting the first gate to a first control signal;
a second resistor connecting the second gate to the first control signal;
a third resistor connecting the second drain to a second control signal;
a fourth resistor connecting the first source to the second control signal; and
a fifth resistor connecting the second source and the first drain to the second control signal;
wherein:
the second control signal is a level-shifted compliment of the first control signal;
the capacitance switching element is configured to operate from a power supply configured to deliver a supply voltage potential ($V_{DD}$) and a ground potential;
the first control signal switches between substantially the $V_{DD}$ and substantially one half of the $V_{DD}$; and
the second control signal switches between substantially the ground potential and substantially the $V_{DD}$.

11. A capacitance switching element, comprising:
a first capacitor;
a second capacitor;
a first transistor comprising a first gate, a first source, and a first drain;
a second transistor comprising a second gate, a second source, and a second drain;
a third transistor comprising a third gate, a third source, and a third gate, wherein the first transistor, the second transistor, and the third transistor are coupled in series between the first capacitor and the second capacitor;
a first resistor connecting the first gate to a first control signal;
a second resistor connecting the second gate to the first control signal;
a third resistor connecting the third gate to the first control signal;
a fourth resistor connecting the third drain to a second control signal;
a fifth resistor connecting the third source and the second drain to the second control signal;
a sixth resistor connecting the second source and the first drain to the second control signal; and
a seventh resistor connecting the first source to the second control signal;
wherein:
the capacitance switching element is configured to operate from a power supply configured to deliver a supply voltage potential ($V_{DD}$) and ground potential;
the first control signal is pulled up to substantially the VDD; and
the second control signal switches between (1) substantially the ground potential to connect the first capacitor to the second capacitor, and (2) substantially one and a half times the $V_{DD}$ potential to disconnect the first capacitor from the second capacitor.

12. A capacitance switching element according to claim 11, wherein the first transistor is a thin oxide transistor, the second transistor is a thin oxide transistor, and the third transistor is a thin oxide transistor.

13. A capacitance switching element according to claim 11, further comprising a level-shifting circuit configured to receive a bit control signal and generate the second control signal in response to the bit control signal.

14. An oscillator tuning block comprising a switching element comprising:
a first capacitor;
a second capacitor;
a first transistor comprising a first gate, a first source, and a first drain;
a second transistor comprising a second gate, a second source, and a second drain;
a third transistor comprising a third gate, a third source, and a third gate, wherein the first transistor, the second transistor, and the third transistor are coupled in series between the first capacitor and the second capacitor;
a first resistor connecting the first gate to a first control signal;
a second resistor connecting the second gate to the first control signal;
a third resistor connecting the third gate to the first control signal;
a fourth resistor connecting the third drain to a second control signal;
a fifth resistor connecting the third source and the second drain to the second control signal;
a sixth resistor connecting the second source and the first drain to the second control signal; and
a seventh resistor connecting the first source to the second control signal;
wherein:
the capacitance switching element is configured to operate from a power supply configured to deliver a supply voltage potential ($V_{DD}$) and ground potential;
the first control signal is pulled up to substantially the VDD; and
the second control signal switches between (1) substantially the ground potential to connect the first capacitor to the second capacitor, and (2) substantially one and a half times the $V_{DD}$ potential to disconnect the first capacitor from the second capacitor.

15. An oscillator comprising:
a negative transconductance block; and
a tank circuit,
wherein the tank circuit comprises an inductor and a tuning block, the tuning block comprising:
a switching element comprising:
a first capacitor;
a second capacitor;
a first transistor comprising a first gate, a first source, and a first drain;
a second transistor comprising a second gate, a second source, and a second drain;
a third transistor comprising a third gate, a third source, and a third gate, wherein the first transistor, the second transistor, and the third transistor are coupled in series between the first capacitor and the second capacitor;
a first resistor connecting the first gate to a first control signal;
a second resistor connecting the second gate to the first control signal;
a third resistor connecting the third gate to the first control signal;
a fourth resistor connecting the third drain to a second control signal;
a fifth resistor connecting the third source and the second drain to the second control signal;
a sixth resistor connecting the second source and the first drain to the second control signal; and
a seventh resistor connecting the first source to the second control signal;
wherein:
the capacitance switching element is configured to operate from a power supply configured to deliver a supply voltage potential ($V_{DD}$) and ground potential;
the first control signal is pulled up to substantially the VDD; and
the second control signal switches between (1) substantially the ground potential to connect the first capacitor to the second capacitor and, (2) substantially one and a half times the $V_{DD}$ potential to disconnect the first capacitor from the second capacitor.

16. A transceiver comprising a receiver and a transmitter, wherein at least one of the receiver and the transmitter comprises an oscillator comprising:
a negative transconductance block; and
a tank circuit,
wherein the tank circuit comprises an inductor and a tuning block, the tuning block comprising:
a switching element comprising:
a first capacitor;
a second capacitor;
a first transistor comprising a first gate, a first source, and a first drain;
a second transistor comprising a second gate, a second source, and a second drain;
a third transistor comprising a third gate, a third source, and a third gate, wherein the first transistor, the second transistor, and the third transistor are coupled in series between the first capacitor and the second capacitor;
a first resistor connecting the first gate to a first control signal;
a second resistor connecting the second gate to the first control signal;
a third resistor connecting the third gate to the first control signal;
a fourth resistor connecting the third drain to a second control signal;
a fifth resistor connecting the third source and the second drain to the second control signal;
a sixth resistor connecting the second source and the first drain to the second control signal; and
a seventh resistor connecting the first source to the second control signal;
wherein:
the capacitance switching element is configured to operate from a power supply configured to deliver a supply voltage potential ($V_{DD}$) and ground potential;
the first control signal is pulled up to substantially the VDD; and
the second control signal switches between (1) substantially the ground potential to connect the first capacitor to the second capacitor, and (2) substantially one and a half times the $V_{DD}$ potential to disconnect the first capacitor from the second capacitor.

17. An access terminal comprising a transceiver comprising:
a receiver; and
a transmitter,
wherein at least one of the receiver and the transmitter comprises an oscillator comprising:
a negative transconductance block; and
a tank circuit,
wherein the tank circuit comprises an inductor and a tuning block, the tuning block comprising:
a switching element comprising:
a first capacitor;
a second capacitor;
a first transistor comprising a first gate, a first source, and a first drain;
a second transistor comprising a second gate, a second source, and a second drain;
a third transistor comprising a third gate, a third source, and a third gate, wherein the first transistor, the second transistor, and the third transistor are coupled in series between the first capacitor and the second capacitor;
a first resistor connecting the first gate to a first control signal;
a second resistor connecting the second gate to the first control signal;
a third resistor connecting the third gate to the first control signal;
a fourth resistor connecting the third drain to a second control signal;
a fifth resistor connecting the third source and the second drain to the second control signal;
a sixth resistor connecting the second source and the first drain to the second control signal; and
a seventh resistor connecting the first source to the second control signal;
wherein:
the capacitance switching element is configured to operate from a power supply configured to deliver a supply voltage potential ($V_{DD}$) and ground potential;
the first control signal is pulled up to substantially the VDD; and
the second control signal switches between (1) substantially the ground potential to connect the first capacitor to the second capacitor, and (2) substantially one and a half times the $V_{DD}$ potential to disconnect the first capacitor from the second capacitor.

18. A capacitance switching element, comprising:
a first capacitor;
a second capacitor;
a plurality of n transistors, n being at least three, each transistor of the plurality of n transistors comprising a gate, a source, and a drain, wherein the n transistors are coupled in series between the first capacitor and the second capacitor;
a first plurality of resistors connecting the gates of the transistors to a first control signal; and a second plurality of resistors connecting the drains and sources of the transistors to a second control signal, wherein:

the capacitance switching element is configured to operate from a power supply configured to deliver a supply voltage potential ($V_{DD}$) and a ground potential;

the first control signal switches between substantially the $V_{DD}$ and substantially $((n-1)/2)$ times the $V_{DD}$; and the second control signal switches between substantially the ground potential and substantially $(n/2)$ times the $V_{DD}$ potential.

19. A capacitance switching element according to claim 18, further comprising a level-shifting circuit configured to receive a bit control signal and generate the first control signal and the second control signal in response to the bit control signal.

20. A method of switching capacitance, the method comprising:

providing a first capacitor and a second capacitor;

providing a first transistor and a second transistor coupled in series between the first capacitor and the second capacitor;

biasing gates of the first and second transistors at substantially a supply voltage $V_{DD}$ and biasing sources and drains of the first and second transistors at substantially ground potential to connect the first capacitor to the second capacitor; and biasing the gates of the first and second transistors at substantially one half of the $V_{DD}$ and biasing the sources and drains of the first and second transistors at substantially the $V_{DD}$ to disconnect the first capacitor from the second capacitor.

21. A method of switching capacitance according to claim 20, further comprising:

operating a level shifting circuit to generate from a bit control signal a first control signal for biasing the gates and the second control signal for biasing the sources and drains.

22. A method of switching capacitance according to claim 21, wherein the first and second transistors are thin oxide transistors.

23. A method of switching capacitance, the method comprising:

providing a first capacitor and a second capacitor;

providing a plurality of n transistors, n being at least three, wherein the transistors of the plurality of transistors are coupled in series between the first capacitor and the second capacitor;

biasing gates of each transistor of the plurality of transistors at substantially a supply voltage $V_{DD}$ and biasing sources and drains of said each transistor at substantially ground potential to connect the first capacitor to the second capacitor; and biasing the gates at substantially $((n-1)/2)$ times $V_{DD}$ and biasing the sources and drains at substantially $(n/2)$ times $V_{DD}$ to disconnect the first capacitor from the second capacitor.

24. A method of switching capacitance according to claim 23, further comprising:

operating a level shifting circuit to generate from a bit control signal at least one of (1) a first control signal for biasing the gates, and (2) a second control signal for biasing the sources and drains.

25. A method of switching capacitance according to claim 24, wherein said each transistor is a thin oxide transistor.

26. A capacitance switching element, comprising:

a first capacitor;

a second capacitor;

a first transistor;

a second transistor, wherein the first transistor and the second transistor are coupled in series between the first capacitor and the second capacitor;

means for biasing gates of the first and second transistors at substantially a supply voltage $V_{DD}$ and for biasing sources and drains of the first and second transistors at substantially ground potential to connect the first capacitor to the second capacitor; and means for biasing the gates of the first and second transistors at substantially one half of the $V_{DD}$ and for biasing the sources and drains of the first and second transistors at substantially the $V_{DD}$ to disconnect the first capacitor from the second capacitor.

27. A capacitance switching element according to claim 26, further comprising:

means for operating a level shifting circuit to generate from a bit control signal a first control signal for biasing the gates and the second control signal for biasing the sources and drains.

28. A capacitance switching element according to claim 27, wherein the first and second transistors are thin oxide transistors.

29. A capacitance switching element, comprising:

a first capacitor;

a second capacitor;

a plurality of n transistors, n being at least three, wherein the transistors of the plurality of transistors are coupled in series between the first capacitor and the second capacitor;

means for biasing gates of each transistor of the plurality of transistors at substantially a supply voltage $V_{DD}$ and biasing sources and drains of said each transistor at substantially ground potential to connect the first capacitor to the second capacitor; and means for biasing the gates at substantially $((n-1)/2)$ times $V_{DD}$ and biasing the sources and drains at substantially $(n/2)$ times $V_{DD}$ to disconnect the first capacitor from the second capacitor.

30. A capacitance switching element according to claim 29, further comprising:

means for operating a level shifting circuit to generate from a bit control signal at least one of (1) a first control signal for biasing the gates, and (2) a second control signal for biasing the sources and drains.

31. A capacitance switching element according to claim 30, wherein said each transistor is a thin oxide transistor.

32. A non-transitory computer-readable storage medium having stored thereon processor executable software instructions configured to cause the processor to perform operations comprising:

biasing gates of a first transistor and a second transistor coupled in series between a first capacitor and a second capacitor at substantially a supply voltage $V_{DD}$ and biasing sources and drains of the first and second transistors at substantially ground potential to connect the first capacitor to the second capacitor; and biasing the gates of the first and second transistors at substantially one half of the $V_{DD}$ and biasing the sources and drains of the first and second transistors at substantially the $V_{DD}$ to disconnect the first capacitor from the second capacitor.

33. A non-transitory computer-readable storage medium according to claim 32, wherein the stored processor executable software instructions are configured to cause the processor to perform operations further comprising:

operating a level shifting circuit to generate from a bit control signal a first control signal for biasing the gates and the second control signal for biasing the sources and drains.

34. A non-transitory computer-readable storage medium having stored thereon processor executable software instructions configured to cause the processor to perform operations comprising:

biasing gates of each transistor of a plurality of n transistors, n being at least three, at substantially a supply voltage $V_{DD}$ and biasing sources and drains of said each transistor at substantially ground potential to connect a first capacitor to a second capacitor, wherein the transistors of the plurality of transistors are coupled in series between the first capacitor and the second capacitor; and biasing the gates at substantially $((n-1)/2)$ times $V_{DD}$ and biasing the sources and drains at substantially $(n/2)$ times $V_{DD}$ to disconnect the first capacitor from the second capacitor.

35. A non-transitory computer-readable storage medium according to claim 34, wherein the stored processor executable software instructions are configured to cause the processor to perform operations further comprising:

operating a level shifting circuit to generate from a bit control signal at least one of (1) a first control signal for biasing the gates, and (2) a second control signal for biasing the sources and drains.

* * * * *